(12) United States Patent
Xuan et al.

(10) Patent No.: US 12,279,480 B2
(45) Date of Patent: Apr. 15, 2025

(54) DISPLAY SUBSTRATE AND DISPLAY APPARATUS USING PIXEL DRIVE CIRCUIT AND MICRO INTEGRATED CIRCUIT TO JOINTLY DRIVE LIGHT-EMITTING ELEMENTS TO EMIT LIGHT

(71) Applicant: BOE Technology Group Co., Ltd., Beijing (CN)

(72) Inventors: Minghua Xuan, Beijing (CN); Haoliang Zheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 899 days.

(21) Appl. No.: 17/406,113

(22) Filed: Aug. 19, 2021

(65) Prior Publication Data

US 2022/0085127 A1   Mar. 17, 2022

(30) Foreign Application Priority Data

Sep. 17, 2020   (CN) .......................... 202010980474.2

(51) Int. Cl.
*H10K 59/121*   (2023.01)
*G09G 3/3233*   (2016.01)
*G09G 3/3266*   (2016.01)
*G09G 3/3275*   (2016.01)

(52) U.S. Cl.
CPC ....... *H10K 59/1213* (2023.02); *G09G 3/3233* (2013.01); *G09G 3/3266* (2013.01); *G09G 3/3275* (2013.01); *H10K 59/1216* (2023.02)

(58) Field of Classification Search
CPC .......... H10K 59/1213; H10K 59/1216; G09G 3/3266; G09G 3/3275; G09G 3/3233
See application file for complete search history.

(56) References Cited

U.S. PATENT DOCUMENTS

| | | | |
|---|---|---|---|
| 10,395,589 B1 * | 8/2019 | Vahid Far | G09G 3/3208 |
| 10,395,590 B1 * | 8/2019 | Lin | G09G 3/3275 |
| 10,395,594 B1 * | 8/2019 | Charisoulis | G09G 3/3241 |
| 2018/0197471 A1 * | 7/2018 | Rotzoll | G09G 3/2003 |
| 2020/0249526 A1 * | 8/2020 | Gu | G02B 6/0028 |
| 2021/0166620 A1 * | 6/2021 | Kim | G09G 3/035 |
| 2022/0085127 A1 * | 3/2022 | Xuan | G09G 3/3266 |
| 2023/0351946 A1 * | 11/2023 | Han | H01L 27/156 |

* cited by examiner

*Primary Examiner* — Jami Valentine Miller
(74) *Attorney, Agent, or Firm* — Ling Wu; Stephen Yang; Ling and Yang Intellectual Property

(57) ABSTRACT

Provided is a display substrate, including: a substrate, multiple pixel units disposed on the substrate and at least one micro integrated circuit. Each pixel unit includes multiple sub-pixels, and at least one sub-pixel of the multiple sub-pixels includes a light-emitting element and a pixel drive circuit electrically connected to the light-emitting element. The pixel drive circuit includes at least one thin film transistor. The at least one micro integrated circuit is electrically connected to at least one pixel unit.

20 Claims, 10 Drawing Sheets

DISPLAY SUBSTRATE AND DISPLAY APPARATUS USING PIXEL DRIVE CIRCUIT AND MICRO INTEGRATED CIRCUIT TO JOINTLY DRIVE LIGHT-EMITTING ELEMENTS TO EMIT LIGHT

CROSS-REFERENCE TO RELATED APPLICATION

The present application claims priority of Chinese Patent Application No. 202010980474.2 filed to the CNIPA on Sep. 17, 2020, the content of which is incorporated herein by reference.

TECHNICAL FIELD

Embodiments of the present disclosure relate to the field of display technology, in particular to a display substrate and a display apparatus.

BACKGROUND

A light-emitting diode (LED) has characteristics of low driving voltage, ultra-high brightness, long life and high temperature resistance, etc., while micro LEDs are considered as a next generation of display panel technology.

SUMMARY

Following is a summary of the subject matter described herein in detail. The summary is not intended to limit the scope of protection of the claims.

An embodiment of the present disclosure provides a display substrate and a display apparatus.

In one aspect, an embodiment of the present disclosure provides a display substrate, including: a substrate, multiple pixel units disposed on the substrate and at least one micro integrated circuit. Each pixel unit includes multiple sub-pixels, and at least one sub-pixel of the multiple sub-pixels includes a light-emitting element and a pixel drive circuit electrically connected to the light-emitting element; the pixel drive circuit includes at least one thin film transistor; and the at least one micro integrated circuit is electrically connected to at least one pixel unit.

In some exemplary embodiments, the pixel drive circuit is configured to control an amplitude of a drive current of the light-emitting element, and the micro integrated circuit is configured to control pulse widths of drive currents of multiple light-emitting elements.

In some exemplary embodiments, each micro integrated circuit includes multiple pulse width modulation signal output terminals, and the multiple pulse width modulation signal output terminals of two micro integrated circuits are connected to multiple light-emitting elements of three pixel units in one-to-one correspondence.

In some exemplary embodiments, the pixel drive circuit includes a first thin film transistor; a control electrode of the first thin film transistor is connected to a data signal terminal, a first electrode of the first thin film transistor is connected to a first power supply terminal, and a second electrode of the first thin film transistor is connected to a first electrode of the light-emitting element; and a second electrode of the light-emitting element is connected to the micro integrated circuit.

In some exemplary embodiments, the pixel drive circuit includes a second thin film transistor, a third thin film transistor, a fourth thin film transistor, a fifth thin film transistor, a sixth thin film transistor, a seventh thin film transistor, an eighth thin film transistor and a first capacitor. A control electrode of the second thin film transistor is connected to a first node, a first electrode of the second thin film transistor is connected to a second electrode of the eighth thin film transistor and a second electrode of the third thin film transistor, and a second electrode of the second thin film transistor is connected to a first electrode of the fifth thin film transistor and a second electrode of the fourth thin film transistor. A control electrode of the third thin film transistor is connected to a scanning signal terminal, and a first electrode of the third thin film transistor is connected to a data signal terminal. A control electrode of the fourth thin film transistor is connected to the scanning signal terminal, and a first electrode of the fourth thin film transistor is connected to the first node. A control electrode of the fifth thin film transistor is connected to a light-emitting control terminal, and a second electrode of the fifth thin film transistor is connected to a first electrode of the light-emitting element. A control electrode of the sixth thin film transistor is connected to a reset signal terminal, a first electrode of the sixth thin film transistor is connected to the first node, and a second electrode of the sixth thin film transistor is connected to an initial voltage terminal. A control electrode of the seventh thin film transistor is connected to the reset signal terminal, a first electrode of the seventh thin film transistor is connected to the second electrode of the fifth thin film transistor, and a second electrode of the seventh thin film transistor is connected to the initial voltage terminal. A control electrode of the eighth thin film transistor is connected to the light-emitting control terminal, and a first electrode of the eighth thin film transistor is connected to a first power supply terminal. A first electrode of the first capacitor is connected to the first power supply terminal, and a second electrode of the first capacitor is connected to the first node. A second electrode of the light-emitting element is connected to the micro integrated circuit.

In some exemplary embodiments, the pixel drive circuit is configured to control a pulse width of a drive current of the light-emitting elements, and the micro integrated circuit is configured to control amplitudes of drive currents of multiple light-emitting elements.

In some exemplary embodiments, each micro integrated circuit includes multiple drive current output terminals, and the multiple drive current output terminals of each micro integrated circuit are connected to multiple light-emitting elements of three pixel units in one-to-one correspondence.

In some exemplary embodiments, the pixel drive circuit includes a time data writing unit, a storage unit and a switching unit. The time data writing unit is connected to a first time signal terminal, a second time signal terminal, a first control signal terminal, a second control signal terminal and a second node, and is configured to output a first time signal of the first time signal terminal to the second node under the control of the first control signal terminal, or, output a second time signal of the second time signal terminal to the second node under the control of the second control signal terminal. The storage unit is connected to the second node and a ground terminal, and is configured to store the first time signal or the second time signal written by the time data writing unit. The switching unit is connected to the second node, the micro integrated circuit and a first electrode of the light-emitting element, and is configured to supply a drive current generated by the micro integrated circuit to the first electrode of the light-emitting element under the control of the first time signal or the second time signal.

In some exemplary embodiments, the time data writing unit includes: a ninth thin film transistor and a tenth thin film transistor. A control electrode of the ninth thin film transistor is connected to the first control signal terminal, a first electrode of the ninth thin film transistor is connected to the first time signal terminal, and a second electrode of the ninth thin film transistor is connected to the second node. A control electrode of the tenth thin film transistor is connected to the second control signal terminal, a first electrode of the tenth thin film transistor is connected to the second time signal terminal, and a second electrode of the tenth thin film transistor is connected to the second node.

In some exemplary embodiments, the storage unit includes a second capacitor; a first electrode of the second capacitor is connected to the second node, and a second electrode of the second capacitor is connected to the ground terminal.

In some exemplary embodiments, the switching unit includes an eleventh thin film transistor; a control electrode of the eleventh thin film transistor is connected to the second node, a first electrode of the eleventh thin film transistor is connected to the micro integrated circuit, and a second electrode of the eleventh thin film transistor is connected to the first electrode of the light-emitting element.

In another aspect, an embodiment of the present disclosure provides a display apparatus including any of the above display substrates.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
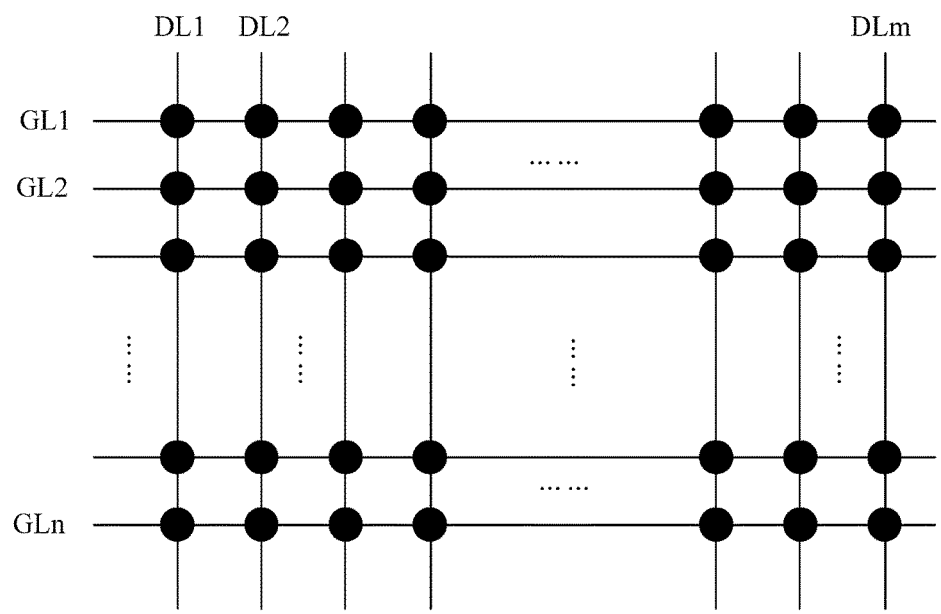
FIG. 1 is a schematic diagram of driving of a light-emitting diode display substrate.

The embodiments of the present disclosure are described below with reference to the accompanying drawings. The embodiments may be implemented in a number of different forms. Those of ordinary skills in the art will readily understand the fact that implementations and contents may be transformed into one or more of forms without departing from the spirit and scope of the present disclosure. Therefore, the present disclosure should not be interpreted as being limited to the content recited in the following embodiments. Without conflict, the embodiments in the present disclosure and the features in the embodiments may be randomly combined with each other.

In the drawings, size of one or more constituent elements, or thickness or region of a layer, is sometimes exaggerated for clarity. Therefore, an embodiment of the present disclosure is not necessarily limited to the size, and shapes and dimensions of multiple components in the drawings do not reflect real scales. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the present disclosure, "multiple" means two or more in quantity.

In the present disclosure, for the sake of convenience, wordings such as "central", "upper", "lower", "front", "rear", "vertical", "horizontal", "top", "bottom", "inner", "outer" and the others describing the orientations or positional relations are used to depict positional relations of elements with reference to the drawings, which are only convenient for describing the specification and simplifying description, rather than for indicating or implying that the apparatus or element referred to must have a specific orientation, or must be constructed and operated in a particular orientation, and therefore, those wordings cannot be construed as limitations on the present disclosure. The positional relations of the constituent elements may be appropriately changed according to the direction in which constituent elements are described. Therefore, the wordings are not limited in the specification, and may be replaced appropriately according to situations.

In the present disclosure, the terms "installed", "connected" and "coupled" shall be understood in their broadest sense unless otherwise explicitly specified and defined. For example, it may be a fixed connection, a detachable connection, or an integrated connection, may be a mechanical connection or an electrical connection, or may be a direct connection, an indirect connection performed via an intermediate component, or communication of the interiors of two components. For those skilled in the art, the meanings of the above terms in the present disclosure may be understood according to the situation.

In the present disclosure, a transistor refers to an element including at least three terminals, namely, a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. In the present disclosure, the channel region refers to a region through which the current mainly flows.

In the present disclosure, a first electrode of the transistor may be a drain electrode and a second electrode of the transistor may be a source electrode, or a first electrode of the transistor may be a source electrode and a second electrode of the transistor may be a drain electrode. Functions of the "source electrode" and the "drain electrode" are sometimes interchangeable in a case where transistors with opposite polarities are used or in a case where the current direction changes during circuit operation. Therefore, in the present disclosure, "the source electrode" and "the drain electrode" are interchangeable.

In the present disclosure, "an electrical connection" includes a case where constituent elements are connected via an element having a certain electrical action. As long as electrical signals between the connected constituent elements can be received, there is no special limitation to "component having a certain electrical action". Examples of the "element having a certain electrical action" not only include electrodes and wirings, but also include switch elements (such as transistors), resistors, inductors, capacitors, and other elements with one or more functions.

"About" in the present disclose means that limits are not made strictly, and the values within a range of process and measurement errors are allowable.

FIG. 1 is a schematic diagram of driving of a light-emitting diode display substrate. As shown in FIG. 1, a light-emitting diode display substrate includes a light-emitting diode array disposed on a substrate, and the light-emitting diode array is driven by a passive matrix (PM). As shown in FIG. 1, the light-emitting diode array includes m columns and n rows of light-emitting diodes, where both m and n are positive integers. Anodes of each column of light-emitting diodes in the light-emitting diode array are connected to a column scanning line DL, and cathodes of each row of light-emitting diodes are connected to a row scanning line GL. When a Y-th column scanning line and a X-th row scanning line are gated, a light-emitting diode at an intersection position (X, Y) of the two scanning lines will be turned on. The entire light-emitting diode display substrate may be scanned point by point at high speed in the above manner to achieve the picture display. However, the above driving mode requires a higher scanning frequency, e.g., a scanning frequency of 3 KHz and above, to eliminate the discomfort of human eyes caused by flicker. In addition, if the substrate is made of printed circuit board (PCB), a distance between two adjacent light-emitting diodes cannot be 1 mm or less due to the process limitation, which limits the resolution of the display substrate.

At least one exemplary embodiment of the present disclosure provides a display substrate including a substrate, multiple pixel units disposed on the substrate and at least one micro integrated circuit. Each pixel unit includes multiple sub-pixels, and at least one sub-pixel of the multiple sub-pixels includes a light-emitting element and a pixel drive circuit electrically connected to the light-emitting element. The pixel drive circuit includes at least one thin film transistor. The at least one micro integrated circuit is electrically connected to at least one pixel unit.

Compared with the PM driving mode shown in FIG. 1, the display substrate of the present exemplary embodiment uses the pixel drive circuit and the micro integrated circuit to jointly drive the light-emitting elements to emit light, which may achieve higher refresh frequency and more accurate control. Compared with the display substrate in which each light-emitting element is independently driven by the micro integrated circuit, the display substrate of the present exemplary embodiment may save area and the number of the micro integrated circuits used, thereby reducing the cost of the display substrate. Compared with a display substrate in which each light-emitting element is independently driven by the pixel drive circuit including at least one thin film transistor, the display substrate of the present exemplary embodiment is beneficial to reduce power consumption.

In some exemplary embodiments, the substrate may be a glass substrate. The display substrate according to the present exemplary embodiment is made of the glass substrate. Compared with a printed circuit board substrate, the display substrate of the present exemplary embodiment has excellent characteristics such as high transparency, low working voltage, stable performance and large scale, which is beneficial to improve resolution.

In some exemplary embodiments, each pixel unit may include sub-pixels capable of displaying different colors such as red sub-pixels, green sub-pixels and blue sub-pixels. The light-emitting element of the sub-pixel may be a light-emitting diode, for example, a micro light-emitting diode (Micro-LED) or an organic light-emitting diode (OLED). However, this is not limited in the present exemplary embodiment. In order to ensure that the light-emitting diode has high and stable luminous efficiency and uniform main wavelength under different brightness, a drive current controlled by an amplitude and a pulse width needed to be provided with the light-emitting diode. For example, a pulse amplitude modulation (PAM) circuit may provide the amplitude of the drive current, and a pulse width modulation (PWM) circuit may provide the pulse width of the drive current. The drive current may be supplied to the light-emitting element under the common control of the PAM circuit and the PWM circuit.

In some exemplary embodiments, the micro integrated circuit may be an integrated circuit (IC) formed on a wafer using a single crystal silicon process.

In some exemplary embodiments, the pixel drive circuit is configured to control an amplitude of a drive current of a corresponding light-emitting element, and the micro integrated circuit is configured to control pulse widths of drive currents of the multiple light-emitting elements. In the present example, the pixel drive circuit may include a PAM circuit that provides the amplitude of the drive current to the corresponding light-emitting element, and the micro integrated circuit may include the PWM circuit that provides pulse width modulation signals of the drive currents to multiple light-emitting elements. In some examples, each micro integrated circuit includes multiple pulse width modulation signal output terminals, and the multiple pulse width modulation signal output terminals of two micro integrated circuits are connected to multiple light-emitting elements of three pixel units in one-to-one correspondence. For example, two micro-integrated circuits have nine pulse width modulation signal outputs (one micro-integrated circuit has four pulse width modulation signal outputs, the other micro-integrated circuit has five pulse width modulation signal outputs, or one micro-integrated circuit has six pulse width modulation signal outputs and the other micro-integrated circuit has three pulse width modulation signal outputs), and the nine pulse width modulation signal outputs are connected to nine light-emitting elements of three pixel units in one-to-one correspondence. However, this is not limited in the present exemplary embodiment. For example, multiple pulse width modulation signal output terminals of one micro integrated circuit may be connected to multiple light-emitting elements of two or more pixel units in one-to-one correspondence.

In some exemplary embodiments, when the pixel drive circuit is configured to control the amplitude of the drive current of the corresponding light-emitting element, the pixel drive circuit may include a first thin film transistor. A control electrode of the first thin film transistor is connected to a data signal terminal, a first electrode of the first thin film transistor is connected to a first power supply terminal, and a second electrode of the first thin film transistor is connected to a first electrode of the light-emitting element. A second electrode of the light-emitting element is connected to the micro integrated circuit. The first electrode of the light-emitting element may be an anode and the second electrode of the light-emitting element may be a cathode. However, the structure of the pixel drive circuit is not limited in the present exemplary embodiment.

In some exemplary embodiments, when the pixel drive circuit is configured to control the amplitude of the drive current of the corresponding light-emitting element, the pixel drive circuit may include a second thin film transistor, a third thin film transistor, a fourth thin film transistor, a fifth thin film transistor, a sixth thin film transistor, a seventh thin film transistor, an eighth thin film transistor and a first capacitor. A control electrode of the second thin film transistor is connected to a first node, a first electrode of the second thin film transistor is connected to a second electrode of the eighth thin film transistor and a second electrode of the third thin film transistor, and a second electrode of the second thin film transistor is connected to a first electrode of the fifth thin film transistor and a second electrode of the fourth thin film transistor. A control electrode of the third thin film transistor is connected to a scanning signal terminal, and a first electrode of the third thin film transistor is connected to a data signal terminal. A control electrode of the fourth thin film transistor is connected to a scanning signal terminal, and a first electrode of the fourth thin film transistor is connected to the first node. A control electrode of the fifth thin film transistor is connected to a light-emitting control terminal, and a second electrode of the fifth thin film transistor is connected to a first electrode of a light-emitting element. A control electrode of the sixth thin film transistor is connected to a reset signal terminal, a first electrode of the sixth thin film transistor is connected to the first node, and a second electrode of the sixth thin film transistor is connected to an initial voltage terminal. A control electrode of the seventh thin film transistor is connected to the reset signal terminal, a first electrode of the seventh thin film transistor is connected to the second electrode of the fifth thin film transistor, and a second electrode of the seventh thin film transistor is connected to the initial voltage terminal. A control electrode of the eighth thin film transistor is connected to a light-emitting control terminal, and a first electrode of an eighth thin film transistor is connected to a first power supply terminal. A first electrode of the first capacitor is connected to the first power supply terminal, and a second electrode of the first capacitor is connected to the first node. A second electrode of the light-emitting element is connected to the micro integrated circuit. The first electrode of the light-emitting element may be an anode and the second electrode of the light-emitting element may be a cathode. However, the structure of the pixel drive circuit is not limited in the present exemplary embodiment.

In some exemplary embodiments, the pixel drive circuit is configured to control the pulse width of the drive current of the corresponding light-emitting element, and the micro integrated circuit is configured to control amplitudes of drive currents of the multiple light-emitting elements. In the present example, the pixel drive circuit may include a PWM circuit that provides pulse width modulation signal of the drive current to the corresponding light-emitting element, and the micro integrated circuit may include a PAM circuit that provides amplitudes of the drive currents to multiple light-emitting elements. In some examples, each micro integrated circuit includes multiple drive current output terminals, and the multiple drive current output terminals of one micro integrated circuit are connected to multiple light-emitting elements of three pixel units in one-to-one correspondence. However, this is not limited in the present exemplary embodiment. For example, multiple drive current output terminals of one micro integrated circuit may be connected to multiple light-emitting elements of two or other number of pixel units in one-to-one correspondence.

In some exemplary embodiments, when the pixel drive circuit is configured to control the pulse width of the drive current of the corresponding light-emitting element, the pixel drive circuit may include a time data writing unit, a storage unit and a switching unit. The time data writing unit is connected to a first time signal terminal, a second time signal terminal, a first control signal terminal, a second control signal terminal and a second node, and is configured to output a first time signal of the first time signal terminal to the second node under the control of the first control signal terminal, or, output a second time signal of the second time signal terminal to the second node under the control of the second control signal terminal. The storage unit is connected to the second node and a ground terminal, and is configured to store the first time signal or the second time signal written by the time data writing unit. A switching unit is connected to the second node, the micro integrated circuit and the first electrode of the light-emitting element, and is configured to supply a drive current generated by the micro integrated circuit to the first electrode of the light-emitting element under the control of the first time signal or the second time signal. A second electrode of the light-emitting element is connected to a second power supply terminal. The first electrode of the light-emitting element may be an anode and the second electrode of the light-emitting element may be a cathode. However, this is not limited in the present exemplary embodiment.

In some exemplary embodiments, the time data writing unit includes: a ninth thin film transistor and a tenth thin film transistor. A control electrode of the ninth thin film transistor is connected to the first control signal terminal, a first electrode of the ninth thin film transistor is connected to the first time signal terminal, and a second electrode of the ninth thin film transistor is connected to the second node. A control electrode of the tenth thin film transistor is connected to the second control signal terminal, a first electrode of the tenth thin film transistor is connected to the second time signal terminal, and a second electrode of the tenth thin film transistor is connected to the second node.

In some exemplary embodiments, the storage unit includes a second capacitor. A first electrode of the second capacitor is connected to the second node, and a second electrode of the second capacitor is connected to the ground terminal.

In some exemplary embodiments, the switching unit includes an eleventh thin film transistor. A control electrode of the eleventh thin film transistor is connected to the second node, a first electrode of the eleventh thin film transistor is connected to the micro integrated circuit, and a second electrode of the eleventh thin film transistor is connected to the first electrode of the light-emitting element.

The display substrate according to the present embodiment will be illustrated by some examples below in details.

Figure 2:
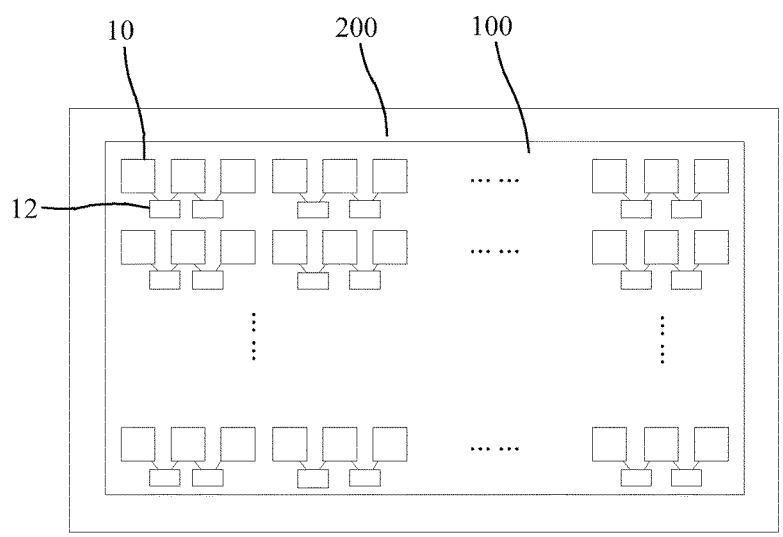
FIG. 2 is a schematic diagram of a structure of a display substrate according to at least one exemplary embodiment of the present disclosure.

FIG. 2 is a schematic diagram of a structure of a display substrate according to at least one embodiment of the present disclosure. As shown in FIG. 2, the display substrate according to the present exemplary embodiment includes a display region 100 and a periphery region 200 located at a periphery of the display region 100. The display region 100 includes multiple pixel units 10 and multiple micro integrated circuits 12 disposed on a glass substrate. Each pixel unit may include multiple sub-pixels. For example, one pixel unit may include a red sub-pixel, a green sub-pixel, and a blue sub-pixel. However, this is not limited in the present exemplary embodiment. In some examples, one pixel unit may include sub-pixels capable of displaying four different colors, such as a red sub-pixel, a blue sub-pixel, a green sub-pixel and a white sub-pixel. Each sub-pixel may include a light-emitting element and a pixel drive circuit electrically connected to the light-emitting element. The light-emitting element may be a light-emitting diode, such as a Micro-LED, or an OLED.

As shown in FIG. 2, two micro integrated circuits 12 may be electrically connected to three pixel units 10, and the two micro integrated circuits 12 are configured to provide pulse widths of drive currents to three adjacent pixel units 10. The pixel drive circuit is configured to supply an amplitude of a drive current to a corresponding light-emitting element. In other words, the pixel drive circuit includes a PAM circuit that provides the amplitude of the drive current to the corresponding light-emitting elements, and the micro integrated circuit includes a PWM circuit that provides pulse width modulation signals of the drive currents to multiple light-emitting elements. As shown in FIG. 2, the micro integrated circuits 12 may be sequentially disposed between two rows of pixel units along a row direction in the display region 100. However, this is not limited in the present exemplary embodiment. In some examples, the micro integrated circuits may be sequentially disposed along a column direction in the display region.

In some examples, the peripheral region 200 may be provided with a control circuit. The control circuit may process externally input image data to match a size and a resolution of the display substrate, and then provide a N-bit digital signal corresponding to the image data to the micro integrated circuit, so that the micro integrated circuit may generate pulse width modulation signals to multiple light-emitting elements according to the received N-bit digital signal. The peripheral region 200 may also be provided with a data driver connected to the control circuit. The control circuit may provide the image data to the data driver and control the data driver to provide the image data signals to the pixel drive circuit, so that the pixel drive circuit may provide a drive current of a corresponding light-emitting element.

In the present exemplary embodiment, the pixel drive circuit is configured to provide the amplitude of the drive current to the corresponding light-emitting elements, and a micro integrated circuit is configured to control pulse widths of drive currents of the multiple light-emitting elements. Compared with a display substrate in which a micro integrated circuit controls both an amplitude and a pulse width of a drive current of a light-emitting element, the present exemplary embodiment may reduce an area of the micro integrated circuit, that is, the area of a part of the circuit that controls the amplitude of the drive current. Taking a micro integrated circuit, in which an area ratio between a part of a circuit that controls an amplitude of a drive current of a light-emitting element and a part of the circuit that controls a pulse width of the drive current of the light-emitting element is 1:2 as an example, that is, the area occupied by the circuit that controls the amplitude of the drive current of the light-emitting element is ⅓ of the area of the micro integrated circuit, and the area occupied by the circuit that controls the pulse width of the drive current of the light-emitting element is ⅔ of the area of the micro integrated circuit, compared with the display substrate with such a micro integrated circuit, the display substrate of the present exemplary embodiment may save about ⅓ of the area of the micro integrated circuit. For example, taking a display product with a distance between adjacent pixel units of 900 microns and a resolution of 160*180 as an example, if one micro integrated circuit is used to provide a amplitude and a pulse width of a drive current to a light-emitting element of one pixel unit, 160*180=28,800 micro integrated circuits are needed on the display substrate. According to the display substrate of the present exemplary embodiment, directly arranging the part of the circuit which controls the amplitude of the drive current of the light-emitting element on the substrate may save a total area of micro integrated circuits. For example, on the basis of not changing an area of a single micro integrated circuit, two micro integrated circuits are configured to control the pulse widths of drive currents of light-emitting elements of three adjacent pixel units, and only 19,200 micro integrated circuits are needed on the display substrate at this time. Therefore, the display substrate of the present exemplary embodiment may greatly save a total area and the number of the micro integrated circuits used, thereby reducing the cost.

In some exemplary embodiments, two micro integrated circuits providing pulse width modulation signals to the light-emitting elements of three pixel units may include: one micro integrated circuit providing pulse width modulation signals to all sub-pixels of the first pixel unit and some sub-pixels of the second pixel unit, and the other micro integrated circuit providing pulse width modulation signals to the other part of the sub-pixels of the second pixel unit and all the sub-pixels of the third pixel unit. However, this is not limited in the present exemplary embodiment.

Figure 3:
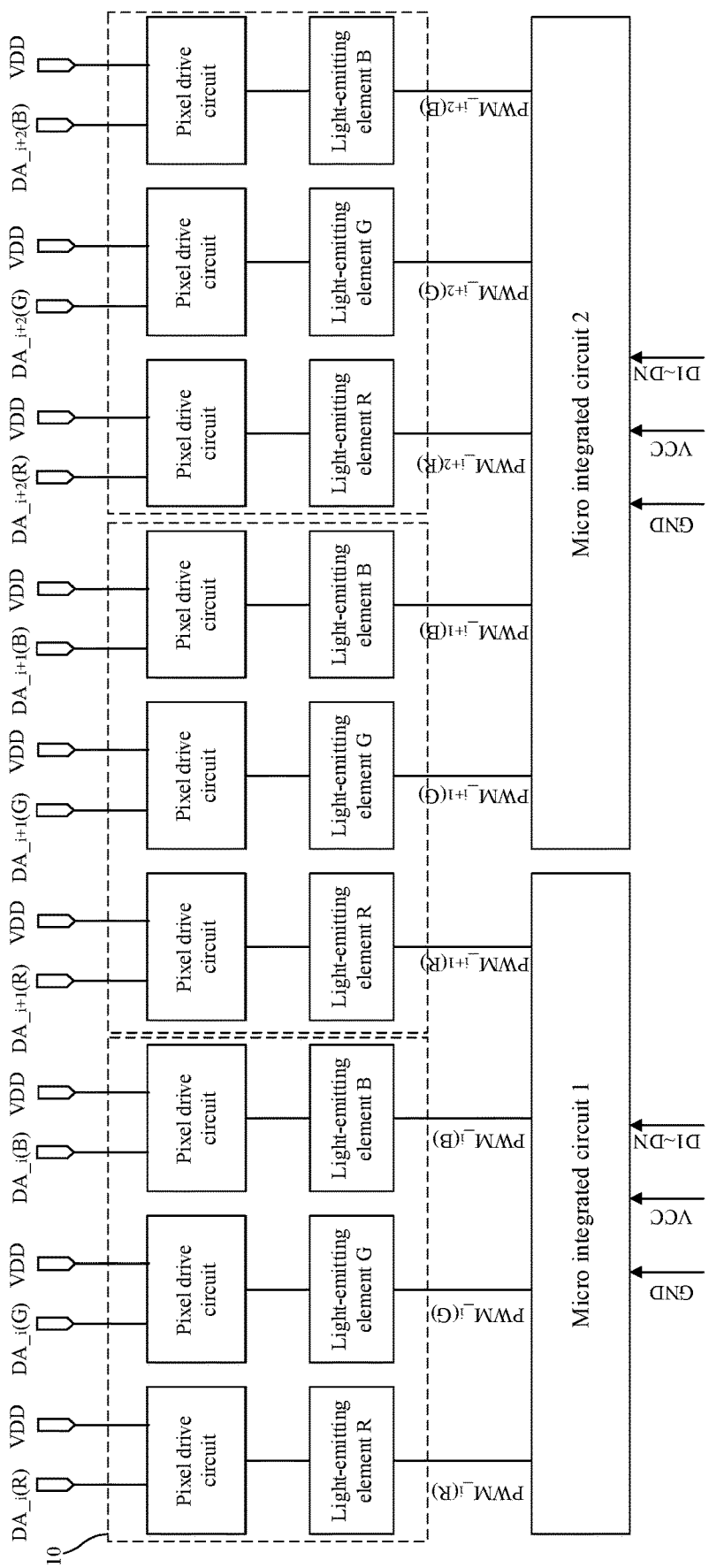
FIG. 3 is a schematic diagram of driving of a display substrate according to at least one exemplary embodiment of the present disclosure.

FIG. 3 is a schematic diagram of driving of a display substrate according to at least one exemplary embodiment of the present disclosure. FIG. 3 illustrates two micro integrated circuits and three adjacent pixel units shown in FIG. 2 (for example, a pixel unit i, a pixel unit (i+1), a pixel unit (i+2), where i is an integer) as examples. As shown in FIG. 3, a micro integrated circuit 1 may be connected to three sub-pixels of the pixel unit i and one sub-pixel (for example, a red sub-pixel) of the pixel unit (i+1). A micro integrated circuit 2 may be connected to the remaining two sub-pixels (e.g., a green sub-pixel and a blue sub-pixel) of the pixel unit (i+1) and three sub-pixels of the pixel unit (i+2). In other words, one micro integrated circuit controls the pulse widths of the drive currents of four light-emitting elements, and the other micro integrated circuit controls the pulse widths of the drive currents of five light-emitting elements.

As shown in FIG. 3, each micro integrated circuit includes digital signal input terminals D1-DN, a ground terminal GND and a power supply input terminal VCC. N is an integer, for example, N is 8, that is, the number of digits of a digital signal is eight. Each micro integrated circuit is configured to generate pulse width modulation signals of multiple light-emitting elements according to the received N-bit digital signal, and provide the pulse width modulation signals to the corresponding light-emitting elements through the pulse width modulation signal output terminals. In some examples, each micro integrated circuit may be integrated with a digital/analog converter, a PWM circuit, etc. However, this is not limited in the present exemplary embodiment.

As shown in FIG. 3, the micro integrated circuit 1 includes four pulse width modulation signal output terminals PWM$_{\_i}$(R), PWM$_{\_i}$(G), PWM$_{\_i}$(B) and PWM$_{\_i+1}$(R), which are respectively electrically connected to a light-emitting element LED$_i$ (R) of the red sub-pixel, a light-emitting element LED$_i$ (G) of the green sub-pixel and a light-emitting element LED$_{i+1}$ (B) of the blue sub-pixel in the pixel unit i, as well as a light-emitting element LED$_{i+1}$ (R) of the red sub-pixel in the pixel unit (i+1). The micro integrated circuit 2 includes five pulse width modulation signal output terminals PWM$_{\_i+1}$(G), PWM$_{\_i+1}$(B), PWM$_{\_i+2}$(R), PWM$_{\_i+2}$(G) and PWM$_{\_i+2}$(B), which are respectively electrically connected to a light-emitting element LED$_{i+1}$(G) of the green sub-pixel and a light-emitting element LED$_{i+1}$(B) of the blue sub-pixel of the pixel unit (i+1), as well as a light-emitting element LED$_{i+2}$(R) of the red sub-pixel, a light-emitting element LED$_{i+2}$(G) of the green sub-pixel and a light-emitting element LED$_{i+2}$(B) of the blue sub-pixel in the pixel unit (i+2).

Figure 4:
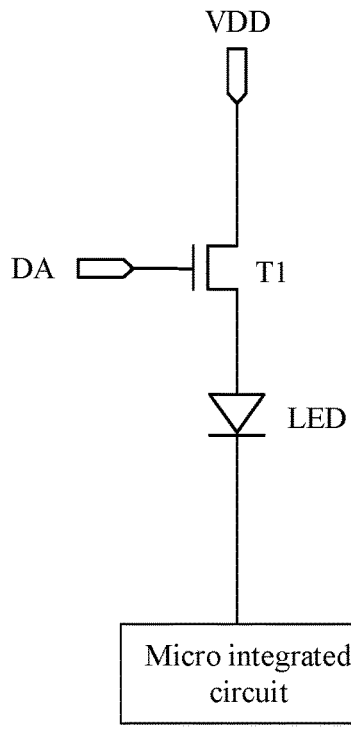
FIG. 4 is an equivalent circuit diagram of a pixel drive circuit according to at least one exemplary embodiment of the present disclosure.

FIG. 4 is an equivalent circuit diagram of a pixel drive circuit according to at least one exemplary embodiment of the present disclosure. As shown in FIG. 4, the pixel drive circuit includes a first thin film transistor T1. A control electrode of the first thin film transistor T1 is connected to a data signal terminal DA, a first electrode of the first thin film transistor T1 is connected to a first power supply terminal VDD, and a second electrode of the first thin film transistor T1 is connected to an anode of a light-emitting element LED. A cathode of the light-emitting element LED is connected to the pulse width modulation signal output terminal of a micro integrated circuit. In the present exemplary embodiment, the first thin film transistor T1 of the pixel drive circuit may be prepared by a low temperature poly-silicon (LTPS) process. The pixel drive circuit may provide an amplitude of a drive current to a corresponding light-emitting element, and the brightness of the light-emitting element under different gray scales may be controlled by combining the pulse width modulation signal of the drive current provided by the micro integrated circuit to the light-emitting element with the amplitude.

FIG. 4 shows only an exemplary structure of a pixel drive circuit that provides an amplitude of a drive current. Those skilled in the art can easily understand that the implementation of the pixel drive circuit that provides the amplitude of the drive current is not limited to this, as long as its function can be achieved.

Figure 5:
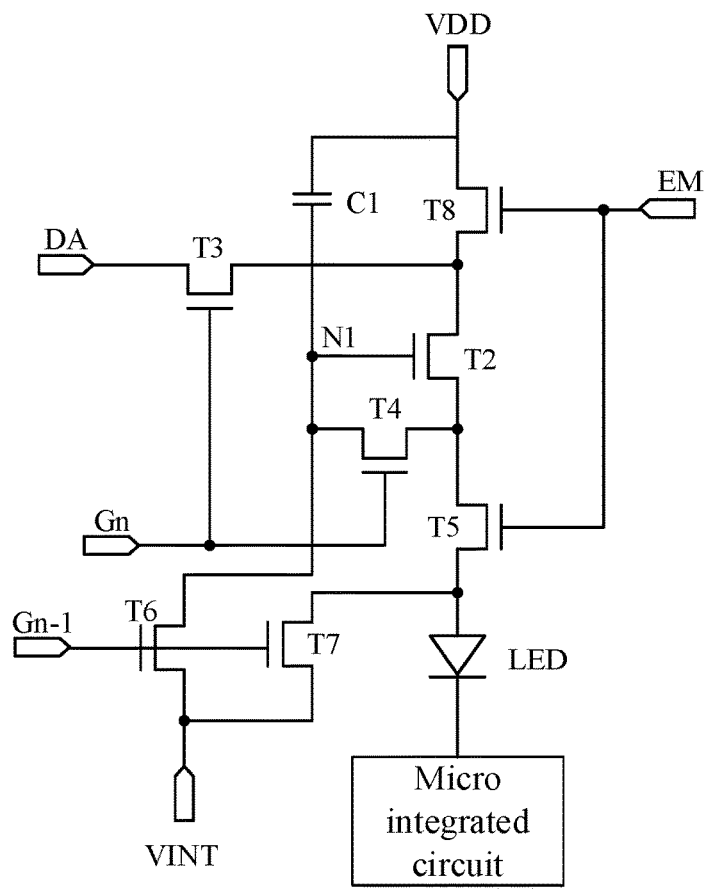
FIG. 5 is another equivalent circuit diagram of a pixel drive circuit according to at least one exemplary embodiment of the present disclosure.

FIG. 5 is another equivalent circuit diagram of a pixel drive circuit according to at least one exemplary embodiment of the present disclosure. As shown in FIG. 5, a pixel drive circuit may include a second thin film transistor T2, a third thin film transistor T3, a fourth thin film transistor T4, a fifth thin film transistor T5, a sixth thin film transistor T6, a seventh thin film transistor T7, an eighth thin film transistor T8 and a first capacitor C1. A control electrode of the second thin film transistor T2 is connected to a first node N1, a first electrode of the second thin film transistor T2 is connected to a second electrode of the eighth thin film transistor T8 and a second electrode of the third thin film transistor T3, and a second electrode of the second thin film transistor T2 is connected to a first electrode of the fifth thin film transistor T5 and a second electrode of the fourth thin film transistor T4. A control electrode of the third thin film transistor T3 is connected to a scanning signal terminal Gn, and a first electrode of the third thin film transistor T3 is connected to a data signal terminal DA. A control electrode of the fourth thin film transistor T4 is connected to the scanning signal terminal Gn, and a first electrode of the fourth thin film transistor T4 is connected to the first node N1. A control electrode of the fifth thin film transistor T5 is connected to a light-emitting control terminal EM, and a second electrode of the fifth thin film transistor T5 is connected to a first electrode of a light-emitting element LED. A control electrode of the sixth thin film transistor T6 is connected to a reset signal terminal Gn−1, a first electrode of the sixth thin film transistor T6 is connected to the first node N1, and a second electrode of the sixth thin film transistor T6 is connected to an initial voltage terminal VINT. A control electrode of the seventh thin film transistor T7 is connected to the reset signal terminal Gn−1, a first electrode of the seventh thin film transistor T7 is connected to the second electrode of the fifth thin film transistor T5, and a second electrode of the seventh thin film transistor T7 is connected to the initial voltage terminal VINT. A control electrode of the eighth thin film transistor T8 is connected to the light-emitting control terminal EM, and a first electrode of the eighth thin film transistor T8 is connected to a first power supply terminal VDD. A first electrode of the first capacitor C1 is connected to the first power supply terminal VDD, and a second electrode of the first capacitor C1 is connected to the first node N1. A second electrode of the light-emitting element LED is connected to a micro integrated circuit. In this exemplary embodiment, the pixel drive circuit has a 7T1C (including 7 thin film transistors and 1 capacitor) structure. The second thin film transistor T2 is a drive transistor, and the third to eighth thin film transistors T3 to T8 are switching transistors. The second to eighth thin film transistors T2 to T8 may be P-type transistors. However, this is not limited in the present exemplary embodiment. In some examples, the pixel drive circuit may adopt a design of 2T1C, 3T1C, or 5T1C.

In some exemplary embodiments, two micro integrated circuits providing pulse width modulation signals to the light-emitting elements of three pixel units may include: one micro integrated circuit providing pulse width modulation signals to all sub-pixels of two of the three pixel units, and the other micro integrated circuit providing pulse width modulation signals to all sub-pixels of the other pixel unit among the three pixel units. However, this is not limited in the present exemplary embodiment.

Figure 6:
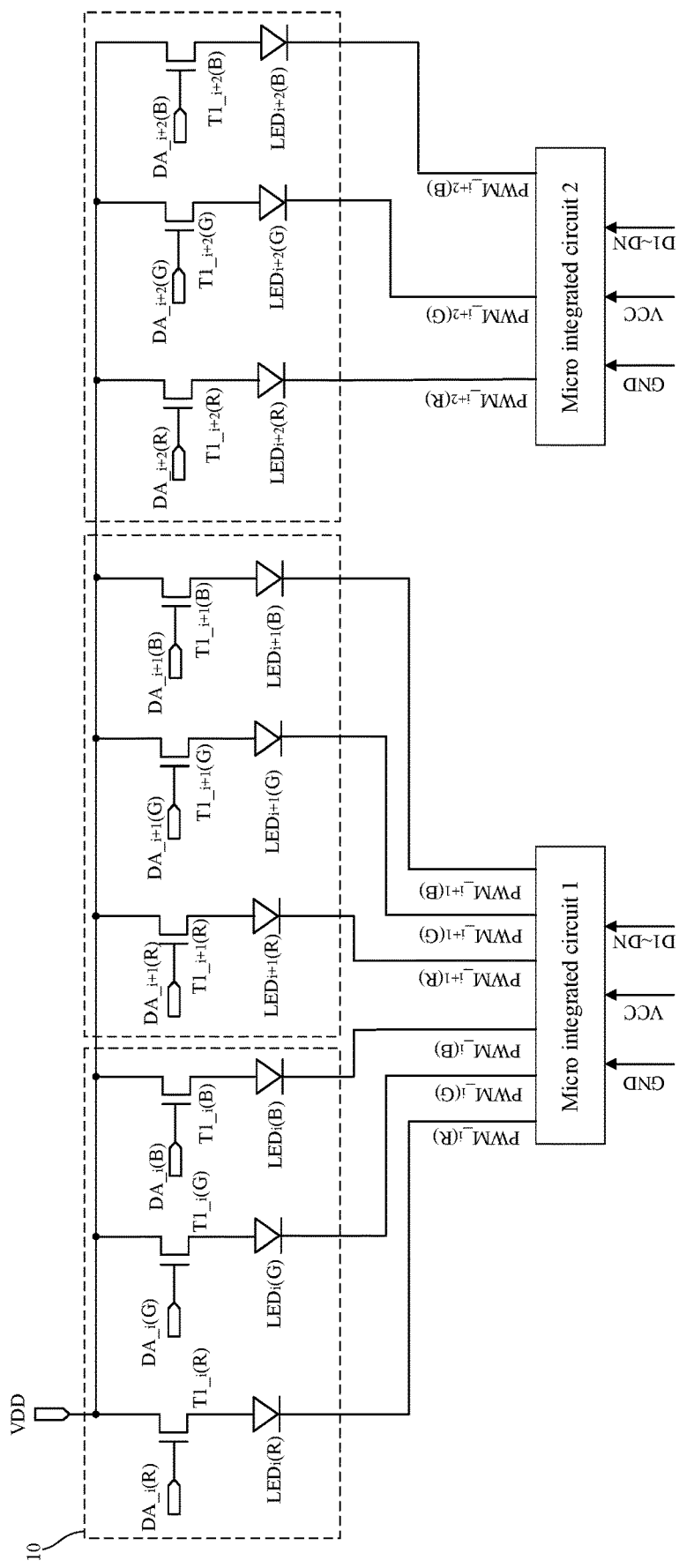
FIG. 6 is another schematic diagram of driving of a display substrate according to at least one exemplary embodiment of the present disclosure.

FIG. 6 is another schematic diagram of driving of a display substrate according to at least one exemplary embodiment of the present disclosure. FIG. 5 illustrates two micro integrated circuits and three pixel units shown in FIG.

2 (for example, a pixel unit i, a pixel unit (i+1), a pixel unit (i+2), where i is an integer) as examples. As shown in FIG. 5, the micro integrated circuit 1 may be connected to three sub-pixels of the pixel unit i and three sub-pixels of the pixel unit (i+1), and the micro integrated circuit 2 may be connected to three sub-pixels of the pixel unit (i+2). In other words, one micro integrated circuit controls the pulse widths of the drive currents of six light-emitting elements, and the other micro integrated circuit controls the pulse widths of the drive currents of three light-emitting elements.

As shown in FIG. 6, each micro integrated circuit includes digital signal input terminals D1-DN, a ground terminal GND and a power supply input terminal VCC. N is an integer, for example, N is 8, that is, the number of digits of a digital signal is eight. Each micro integrated circuit is configured to generate pulse width modulation signals of multiple light-emitting elements according to the received N-bit digital signal, and provide the pulse width modulation signals to the corresponding light-emitting elements through the pulse width modulation signal output terminals. In some examples, each micro integrated circuit may be integrated with a digital/analog converter, a PWM circuit, etc. However, this is not limited in the present exemplary embodiment.

As shown in FIG. 6, the micro integrated circuit 1 includes six pulse width modulation signal output terminals $PWM\_i(R)$, $PWM\_i(G)$, $PWM\_i(B)$, $PWM\_{i+1}(R)$, $PWM\_{i+1}(G)$ and $PWM\_{i+1}(B)$, which are respectively electrically connected to a light-emitting element $LED_i(R)$ of a red sub-pixel, a light-emitting element $LED_i(G)$ of a green sub-pixel and a light-emitting element $LED_i(B)$ of a blue sub-pixel in the pixel unit i, as well as a light-emitting element $LED_{i+1}(R)$ of a red sub-pixel, a light-emitting element $LED_{i+1}(G)$ of a green sub-pixel and a light-emitting element LEDi+1 (B) of a blue sub-pixel in the pixel unit (i+1). The micro integrated circuit 2 includes three pulse width modulation signal output terminals $PWM\_{i+2}(R)$, $PWM\_{i+2}(G)$ and $PWM\_{i+2}(B)$, which are respectively electrically connected to a light-emitting element $LED_{i+2}(R)$ of a red sub-pixel, a light-emitting element $LED_{i+2}(G)$ of a green sub-pixel and a light-emitting element $LED_{i+2}(B)$ of a blue sub-pixel in the pixel unit (i+2).

The implementation of the pixel drive circuit for providing the drive current amplitude may be shown in FIG. 4 or FIG. 5, and will not be repeated here. However, this is not limited in the present exemplary embodiment.

Figure 7:
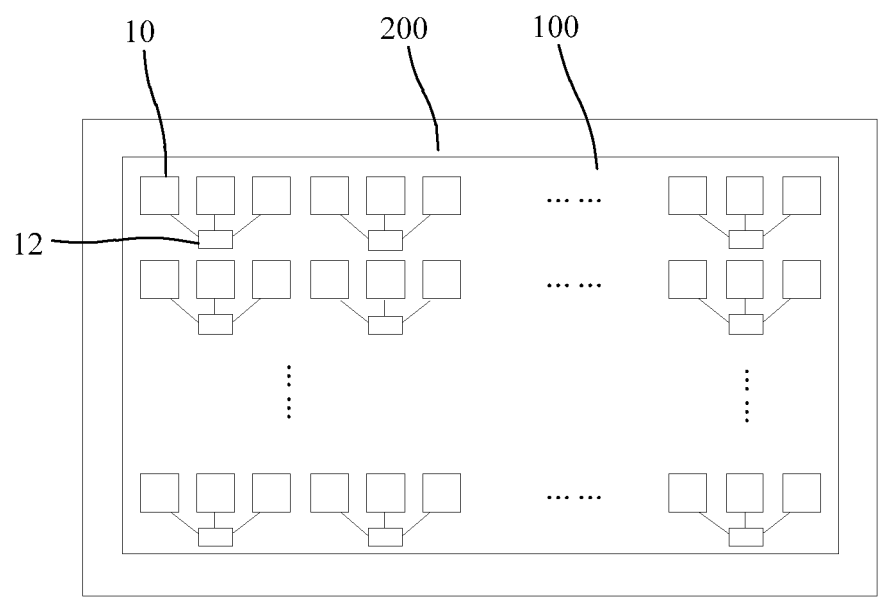
FIG. 7 is another schematic diagram of a structure of a display substrate according to at least one exemplary embodiment of the present disclosure.

FIG. 7 is another schematic diagram of a structure of a display substrate according to at least one exemplary embodiment of the present disclosure. As shown in FIG. 7, the display substrate according to the present exemplary embodiment includes a display region 100 and a periphery region 200 located at a periphery of the display region 100. The display region 100 includes multiple pixel units 10 and multiple micro integrated circuits 12 disposed on a glass substrate. Each pixel unit may include multiple sub-pixels. For example, one pixel unit may include a red sub-pixel, a green sub-pixel, and a blue sub-pixel. However, this is not limited in the present exemplary embodiment. In some examples, a pixel unit may include sub-pixels capable of displaying four different colors, such as a red sub-pixel, a blue sub-pixel, a green sub-pixel and a white sub-pixel. Each sub-pixel may include a light-emitting element and a pixel drive circuit electrically connected to the light-emitting element. The light-emitting element may be a light-emitting diode, such as a Micro-LED, or an OLED.

As shown in FIG. 7, one micro integrated circuit 12 may be electrically connected to three pixel units 10, and one micro integrated circuit 12 is configured to provide amplitudes of drive currents to nine light-emitting elements of the three pixel units 10. The pixel drive circuit is configured to control a pulse width of the drive current of a corresponding light-emitting element. In other words, the pixel drive circuit includes a PWM circuit that provides a pulse width modulation signal of the drive current to the corresponding light-emitting element, and the micro integrated circuit includes a PAM circuit that provides amplitudes of the drive currents to multiple light-emitting elements. As shown in FIG. 7, the micro integrated circuits 12 may be sequentially disposed between two rows of pixel units along a row direction in the display region 100. However, this is not limited in the present exemplary embodiment. In some examples, the micro integrated circuits may be sequentially disposed along a column direction in the display region.

In some examples, the peripheral region 200 may be provided with a control circuit. The control circuit may process externally input image data to match a size and a resolution of the display substrate, and then provide a N-bit digital signal corresponding to the image data to the micro integrated circuit, so that the micro integrated circuit may provide amplitudes of drive currents to multiple light-emitting elements according to the received N-bit digital signal. The peripheral region 200 may also be provided with a data driver and a gate driver connected to the control circuit, and the control circuit may control the data driver to provide time data signals and control the gate driver to provide time control signals so that the data driver provides the time data signals to the pixel drive circuit, and the gate driver provides the time control signals to the pixel drive circuit. Therefore, the pixel drive circuit may control the pulse width of the drive current of the corresponding light-emitting element according to the time data signals and the time control signals.

In the present exemplary embodiment, the pixel drive circuit is configured to control the pulse width of the drive current of the corresponding light-emitting element, and the micro integrated circuit is configured to provide the amplitudes of the drive currents to the multiple light-emitting elements. Compared with a display substrate in which a micro integrated circuit controls both an amplitude and a pulse width of a drive current of a light-emitting element, the present exemplary embodiment may reduce an area of the micro integrated circuit, that is, an area of a part of a circuit that controls the pulse width of the drive current. Taking a micro integrated circuit in which an area ratio between a part of a circuit that controls an amplitude of a drive current of the light-emitting element and a part of the circuit controls a pulse width of the drive current is 1:2 as example, that is, the area occupied by the circuit that controls the amplitude of the drive current of the light-emitting element is ⅓ of the area of the micro integrated circuit, and the area occupied by the circuit that controls the pulse width of the drive current of the light-emitting element is ⅔ of the area of the micro integrated circuit, compared with the display substrate with such a micro integrated circuit, the display substrate of the present exemplary embodiment may save about ⅔ of the area of the micro integrated circuit. For example, taking a display product with a distance between adjacent pixel units of 900 microns and a resolution of 160*180 as an example, if one micro integrated circuit is used to provide a amplitude and a pulse width of a drive current to a light-emitting element of one pixel unit, 160*180=28,800 micro integrated circuits are needed on the display substrate. According to the display substrate of the present exemplary embodiment, directly arranging the part of the circuit that controls the pulse width of the drive current of the light-emitting element on the substrate may save a total area of micro integrated circuits. For example, on the basis of not changing an area of a single micro integrated circuit, one micro integrated circuit is configured to control amplitudes of drive currents of light-emitting elements of three adjacent pixel units, and only 9600 micro integrated circuits are needed on the display substrate at this time. Therefore, the display substrate of the present exemplary embodiment may greatly save a total area and the number of the micro integrated circuits used, thereby reducing the cost.

Figure 8:
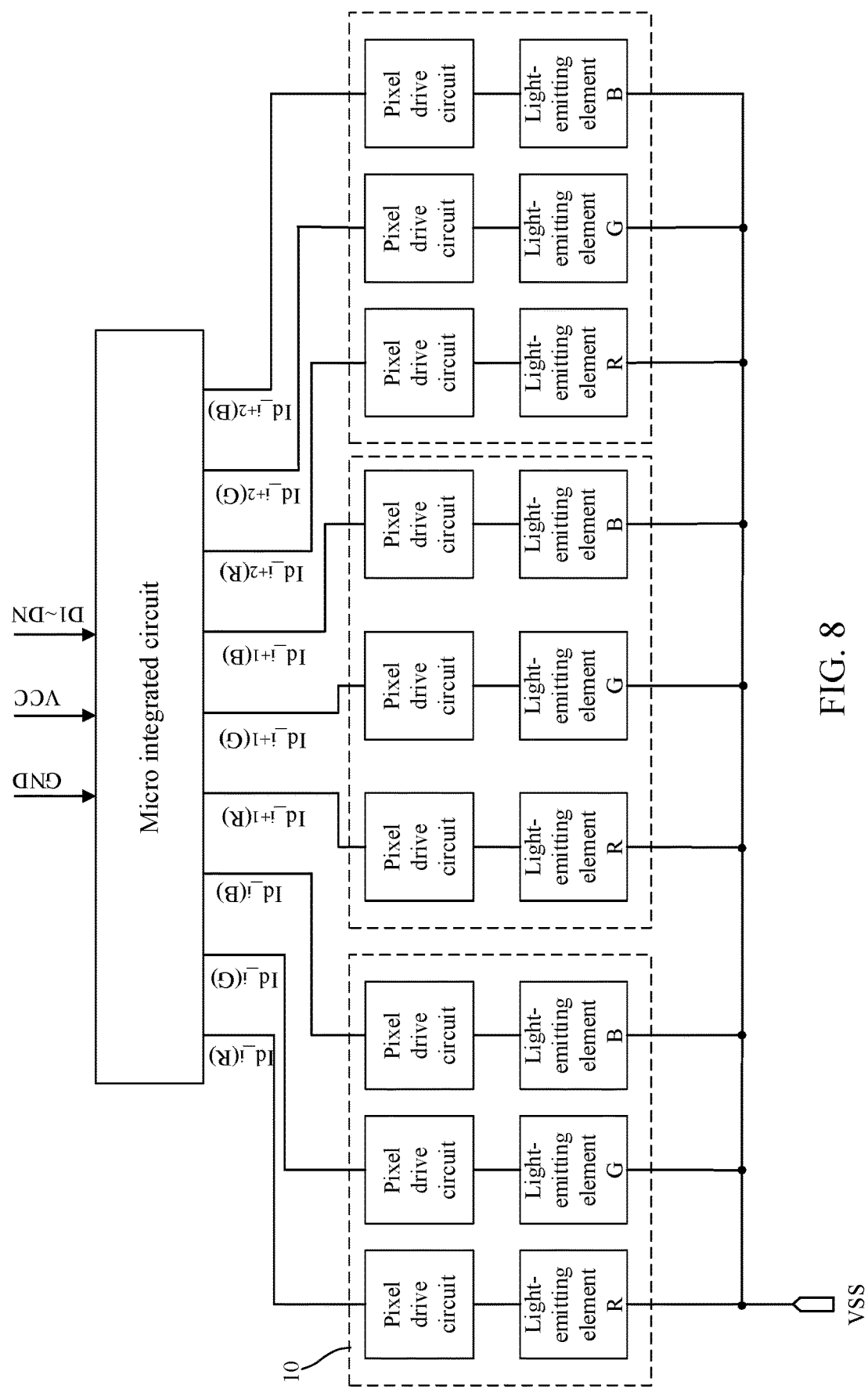
FIG. 8 is another schematic diagram of driving of a display substrate according to at least one exemplary embodiment of the present disclosure.

FIG. 8 is a schematic diagram of driving of a display substrate according to at least one exemplary embodiment of the present disclosure. FIG. 8 illustrates one micro integrated circuit and three pixel units shown in FIG. 7 (for example, a pixel unit i, a pixel unit (i+1), a pixel unit (i+2), where i is an integer) as examples. As shown in FIG. 8, one micro integrated circuit may be connected to three sub-pixels of the pixel unit i, three sub-pixels of the pixel unit (i+1) and three sub-pixels of the pixel unit (i+2). In other words, one micro integrated circuit provides amplitudes of drive currents to nine light-emitting elements.

As shown in FIG. 8, the micro integrated circuit includes digital signal input terminals D1-DN, a ground terminal GND and a power supply input terminal VCC. N is an integer, for example, N is 8, that is, the number of digits of a digital signal is eight. Each micro integrated circuit is configured to generate amplitudes of drive currents of multiple light-emitting elements according to the received N-bit digital signal, and provide the amplitudes of the drive currents to the corresponding light-emitting elements through the drive current output terminals. In some examples, each micro integrated circuit may be integrated with a digital/analog converter, a PAM circuit for drive current, etc. However, this is not limited in the present exemplary embodiment.

As shown in FIG. 8, the micro integrated circuit includes nine drive current output terminals $Id\_i(R)$, $Id\_i(G)$, $Id\_i(B)$, $Id\_{i+1}(R)$, $Id\_{i+1}(G)$, $Id\_{i+1}(B)$, $Id\_{i+2}(R)$, $Id\_{i+2}(G)$, $Id\_{i+2}(B)$, which are respectively electrically connected to the light-emitting elements of the three sub-pixels of the pixel unit i, the light-emitting elements of the three sub-pixels of the pixel unit (i+1), and the light-emitting elements of the three sub-pixels of the pixel unit (i+2).

Figure 9:
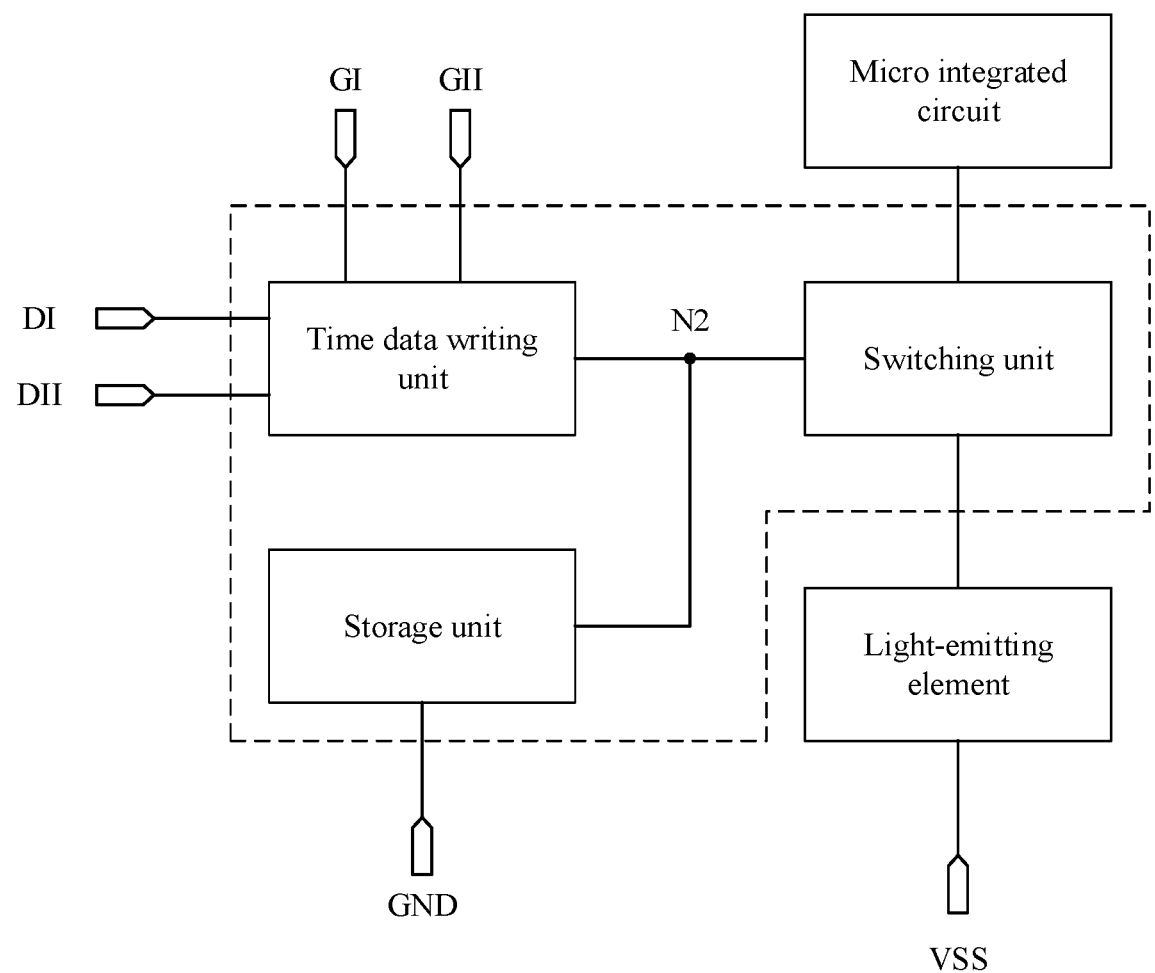
FIG. 9 is another schematic diagram of a structure of a pixel drive circuit according to at least one exemplary embodiment of the present disclosure.

FIG. 9 is another schematic diagram of a structure of a pixel drive circuit according to at least one exemplary embodiment of the present disclosure. As shown in FIG. 9, a pixel drive circuit includes a time data writing unit, a storage unit and a switching unit. The time data writing unit is connected to a first time signal terminal DI, a second time signal terminal DII, a first control signal terminal GI, a second control signal terminal GII and a second node N2, and is configured to output a first time signal of the first time signal terminal DI to the second node N2 under the control of the first control signal terminal DI, or, output a second time signal of the second time signal terminal DII to the second node N2 under the control of the second control signal terminal DII. The storage unit is connected to the second node N2 and a ground terminal GND, and is configured to store the first time signal or the second time signal written by the time data writing unit. The switching unit is connected to the second node N2, a micro integrated circuit and a first electrode of a light-emitting element, and is configured to supply a drive current generated by the micro integrated circuit to the first electrode of the light-emitting element under the control of the first time signal or the second time signal. A second electrode of the light-emitting element is connected to a second power supply terminal VSS. The first electrode of the light-emitting element may be an anode and the second electrode of the light-emitting element may be a cathode.

Figure 10:
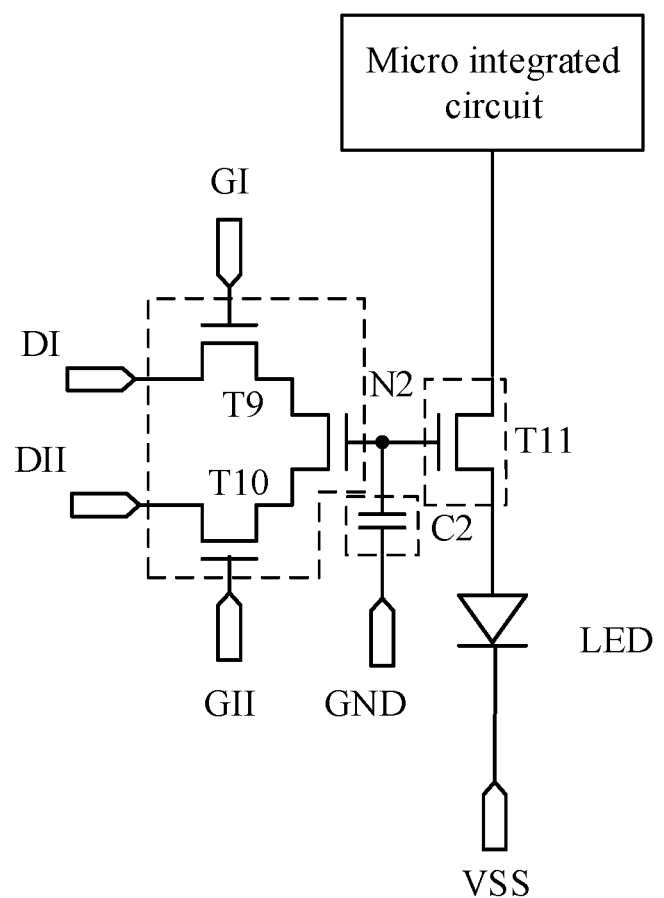
FIG. 10 is an equivalent circuit diagram of a pixel drive circuit according to at least one exemplary embodiment of the present disclosure.

FIG. 10 is an equivalent circuit diagram of a pixel drive circuit according to at least one exemplary embodiment of the present disclosure. As shown in FIG. 10, a time data writing unit includes: a ninth thin film transistor T9 and a tenth thin film transistor T10. A control electrode of the ninth thin film transistor T9 is connected to a first control signal terminal GI, a first electrode of the ninth thin film transistor T9 is connected to the first time signal terminal DI, and a second electrode of the ninth thin film transistor T9 is connected to a second node N2. A control electrode of the tenth thin film transistor T10 is connected to a second control signal terminal GII, a first electrode of the tenth thin film transistor T10 is connected to a second time signal terminal DII, and a second electrode of the tenth thin film transistor T10 is connected to the second node N2. The storage unit includes a second capacitor C2. A first electrode of the second capacitor C2 is connected to the second node N2, and a second electrode of the second capacitor C2 is connected to a ground terminal GND. The switching unit includes an eleventh thin film transistor T11. A control electrode of the eleventh thin film transistor T11 is connected to the second node N2, a first electrode of the eleventh thin film transistor T11 is connected to a micro integrated circuit, and a second electrode of the eleventh thin film transistor T11 is connected to a first electrode of a light-emitting element LED. A second electrode of the light-emitting element LED is connected to a second power supply terminal VSS. The first electrode of the light-emitting element LED is an anode and the second electrode of the light-emitting element LED is a cathode.

FIG. 10 only shows an exemplary structure of a pixel drive circuit that supplies a pulse width modulation signal of a drive current to a light-emitting element. Those skilled in the art can easily understand that the implementation of the pixel drive circuit that provides the pulse width modulation signal of the drive current is not limited to this, as long as its function can be achieved.

Figure 11:
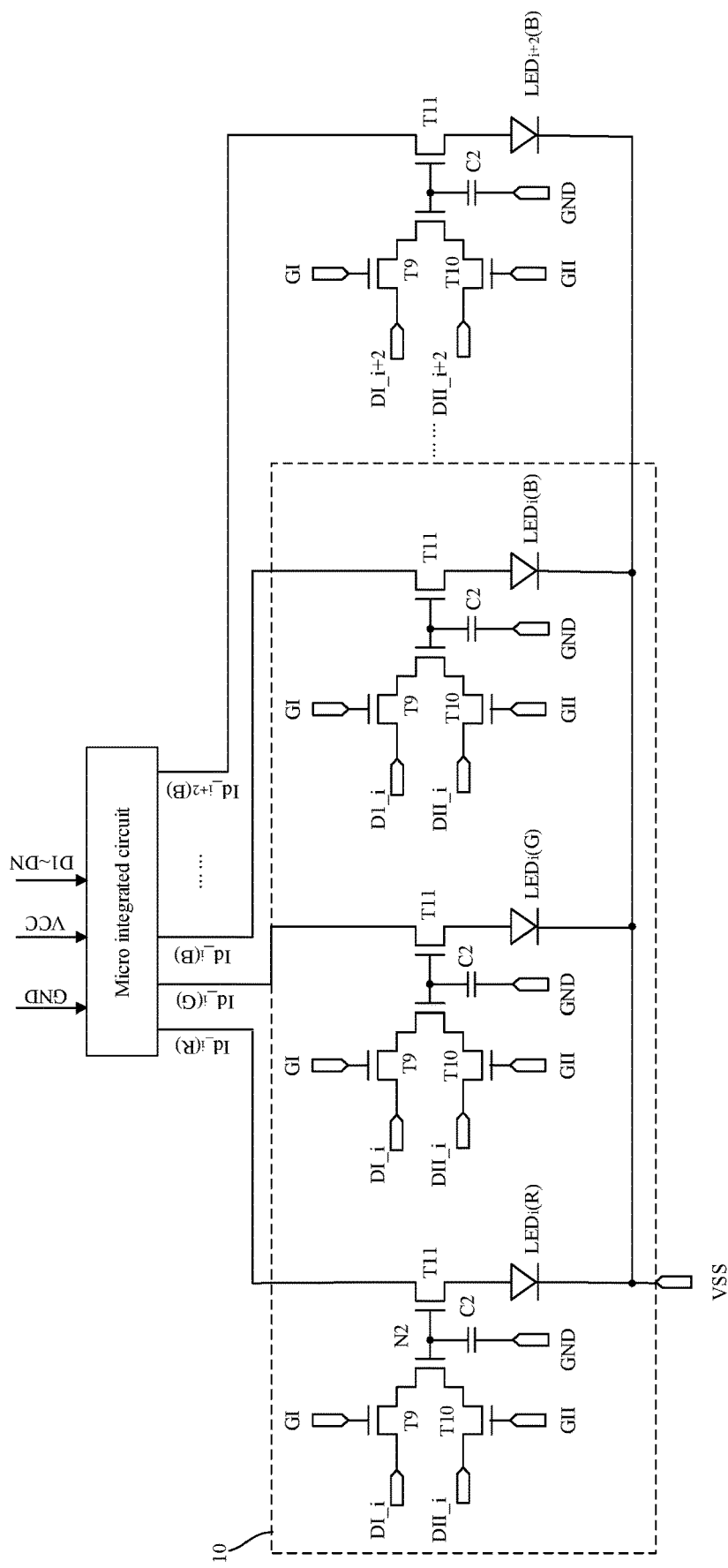
FIG. 11 is another schematic diagram of driving of a display substrate according to at least one exemplary embodiment of the present disclosure.

FIG. 11 is another schematic diagram of driving of a display substrate according to at least one exemplary embodiment of the present disclosure. FIG. 11 illustrates one micro integrated circuit and three adjacent pixel units shown in FIG. 7 (for example, a pixel unit i, a pixel unit (i+1), a pixel unit (i+2), where i is an integer) as examples. In FIG. 11, only three sub-pixels of the pixel unit i and one sub-pixel of the pixel unit (i+1) are illustrated, and other sub-pixels are omitted. As shown in FIG. 10, the micro integrated circuit includes nine drive current output terminals $Id\_i(R)$, $Id\_i(G)$, $Id\_i(B)$, $Id\_{i+1}(R)$, $Id\_{i+1}(G)$, $Id\_{i+1}(B)$, $Id\_{i+2}(R)$, $Id\_{i+2}(G)$, $Id\_{i+2}(B)$, which are respectively electrically connected to a light-emitting element $LED_i$ (R) of a red sub-pixel, a light-emitting element $LED_i$ (G) of a green sub-pixel and a light-emitting element $LED_i$ (B) of a blue sub-pixel in the pixel unit i, and a light-emitting element $LED_{i+1}(R)$ of a red sub-pixel, a light-emitting element $LED_{i+1}$ (G) of a green sub-pixel and a light-emitting element $LED_{i+1}$ (B) of a blue sub-pixel in the pixel unit (i+1), as well as a light-emitting element $LED_{i+2}(R)$ of a red sub-pixel, a light-emitting element $LED_{i+2}(G)$ of a green sub-pixel and a light-emitting element $LED_{i+2}(B)$ of a blue sub-pixel of in pixel unit (i+2).

The implementation of the pixel drive circuit for providing the pulse width of the drive current is shown in FIG. 9 and FIG. 10, and will not be repeated here. However, this is not limited in the present exemplary embodiment.

In the present exemplary embodiment, for the thin film transistor which only plays a switching role on the glass substrate and is a part of the pixel drive circuit, an active layer of the thin film transistor may be made of low-temperature polysilicon, or materials such as oxide and amorphous silicon.

In the present exemplary embodiment, the part of the circuit that provides the amplitude of the drive current is formed in the micro integrated circuit, and the part of the circuit that provides the pulse width modulation signal of the drive current is directly formed on the glass substrate, which contributes to reducing the power consumption of the display substrate. Table 1 shows a table of comparison in which the part of the circuit that provides the amplitude of drive current is formed in the micro integrated circuit versus is directly formed on the glass substrate. LTPS TFT is used as a device which provides the amplitude of the drive current when the part of the circuit that provides the amplitude of the drive current is directly formed on the glass substrate, and a metal oxide semiconductor (MOS) formed on a wafer by a single crystal silicon process is used as the device that provides drive current amplitude when the part of the circuit that provides the amplitude of the drive current is formed in the micro integrated circuit.

TABLE 1

| Pixel Current: 50 microamperes (μA) | LTPS TFT | MOS |
| --- | --- | --- |
| Voltage consumption | 4 V | 1 V |
| Driver Power | 200 μW | 50 μW |
| LED Power | 100 μW | 100 μW |
| Total Power | 300 μW | 150 μW |
| Power Ratio of Driver | 67% | 33% |

As shown in Table 1, taking the LED current as 50 μA and requiring 2V driving voltage as an example, while LTPS TFT needs 4V of cross voltage to generate 50 μA of current, MOS formed by monocrystalline silicon process can generate 50 μA current with smaller than 1V of cross voltage. At this time, when the power of LTPS TFT is 200 microwatts (μW) and the power of LED is 100 μW, the total power is 300 μW, and the power of LTPS TFT on glass substrate accounts for 67%. However, the power of MOS formed by single crystal silicon process is smaller than 50 μW, and the power of LED is 100 μW, so the total power is 150 μW, and the power of MOS accounts for smaller than 33%. It may be seen that the present exemplary embodiment may greatly reduce the power consumption of the display substrate, and may reduce the power of devices other than the light-emitting elements, thus achieving the display technology with the light-emitting elements as the core.

Figure 12:
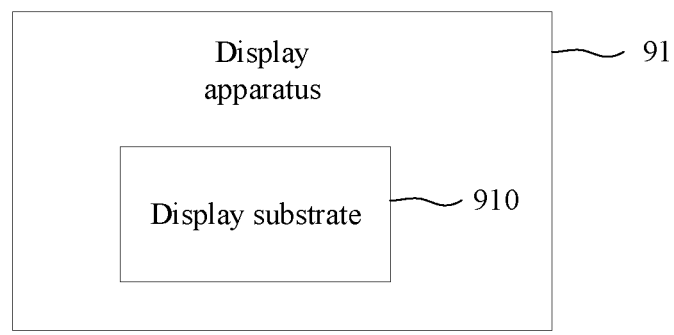
FIG. 12 is a schematic diagram of a display apparatus according to at least one exemplary embodiment of the present disclosure.

FIG. 12 is a schematic diagram of a display apparatus according to at least one exemplary embodiment of the present disclosure. As shown in FIG. 12, the present exemplary embodiment provides a display apparatus 91, which includes a display substrate 910. The display substrate 910 is the display substrate provided in the previous exemplary embodiments. The display substrate 910 may be a LED display substrate such as a micro-LED display substrate or an OLED display substrate. The display apparatus 91 may be any product or component with a display function such as an LED display panel, a mobile phone, a tablet computer, a television, a display, a laptop computer, a digital photo frame, a navigator, etc. However, this is not limited in the present exemplary embodiment.

The drawings in the present disclosure only refer to the structures involved in the present disclosure, and common designs may be referred to for other structures. The embodiments of the present disclosure and the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What we claim is:

1. A display substrate, comprising:
   a substrate, a plurality of pixel units disposed on the substrate and at least one micro integrated circuit;
   wherein each pixel unit comprises a plurality of sub-pixels, and at least one sub-pixel of the plurality of sub-pixels comprises a light-emitting element and a pixel drive circuit electrically connected to the light-emitting element; the pixel drive circuit comprises at least one thin film transistor; and the at least one micro integrated circuit is electrically connected to at least one pixel unit.

2. The display substrate according to claim 1, wherein the pixel drive circuit is configured to control an amplitude of a drive current of the light-emitting element, and the micro integrated circuit is configured to control pulse widths of drive currents of a plurality of light-emitting elements.

3. The display substrate according to claim 2, wherein the micro integrated circuit comprises a plurality of pulse width modulation signal output terminals, and the plurality of pulse width modulation signal output terminals of two micro integrated circuits are connected to a plurality of light-emitting elements of three pixel units in one-to-one correspondence.

4. The display substrate according to claim 2, wherein the pixel drive circuit comprises a first thin film transistor; a control electrode of the first thin film transistor is connected to a data signal terminal, a first electrode of the first thin film transistor is connected to a first power supply terminal, and a second electrode of the first thin film transistor is connected to a first electrode of the light-emitting element; and a second electrode of the light-emitting element is connected to the micro integrated circuit.

5. The display substrate according to claim 2, wherein the pixel drive circuit comprises a second thin film transistor, a third thin film transistor, a fourth thin film transistor, a fifth thin film transistor, a sixth thin film transistor, a seventh thin film transistor, an eighth thin film transistor and a first capacitor;
   a control electrode of the second thin film transistor is connected to a first node, a first electrode of the second thin film transistor is connected to a second electrode of the eighth thin film transistor and a second electrode of the third thin film transistor, and a second electrode of the second thin film transistor is connected to a first electrode of the fifth thin film transistor and a second electrode of the fourth thin film transistor;
   a control electrode of the third thin film transistor is connected to a scanning signal terminal, and a first electrode of the third thin film transistor is connected to a data signal terminal;
   a control electrode of the fourth thin film transistor is connected to the scanning signal terminal, and a first electrode of the fourth thin film transistor is connected to the first node;
   a control electrode of the fifth thin film transistor is connected to a light-emitting control terminal, and a second electrode of the fifth thin film transistor is connected to a first electrode of the light-emitting element;

a control electrode of the sixth thin film transistor is connected to a reset signal terminal, a first electrode of the sixth thin film transistor is connected to the first node, and a second electrode of the sixth thin film transistor is connected to an initial voltage terminal;

a control electrode of the seventh thin film transistor is connected to the reset signal terminal, a first electrode of the seventh thin film transistor is connected to the second electrode of the fifth thin film transistor, and a second electrode of the seventh thin film transistor is connected to the initial voltage terminal;

a control electrode of the eighth thin film transistor is connected to the light-emitting control terminal, and a first electrode of the eighth thin film transistor is connected to a first power supply terminal;

a first electrode of the first capacitor is connected to the first power supply terminal, and a second electrode of the first capacitor is connected to the first node; and a second electrode of the light-emitting element is connected to the micro integrated circuit.

6. The display substrate according to claim 1, wherein the pixel drive circuit is configured to control a pulse width of a drive current of the light-emitting element, and the micro integrated circuit is configured to control amplitudes of drive currents of a plurality of light-emitting elements.

7. The display substrate according to claim 6, wherein the micro integrated circuit comprises a plurality of drive current output terminals, and the plurality of drive current output terminals of the micro integrated circuit are connected to a plurality of light-emitting elements of three pixel units in one-to-one correspondence.

8. The display substrate according to claim 6, wherein the pixel drive circuit comprises a time data writing unit, a storage unit and a switching unit;

the time data writing unit is connected to a first time signal terminal, a second time signal terminal, a first control signal terminal, a second control signal terminal and a second node, and is configured to output a first time signal of the first time signal terminal to the second node under the control of the first control signal terminal, or, output a second time signal of the second time signal terminal to the second node under the control of the second control signal terminal;

the storage unit is connected to the second node and a ground terminal, and is configured to store the first time signal or the second time signal written by the time data writing unit; and the switching unit is connected to the second node, the micro integrated circuit and a first electrode of the light-emitting element, and is configured to supply a drive current generated by the micro integrated circuit to the first electrode of the light-emitting element under the control of the first time signal or the second time signal.

9. The display substrate according to claim 8, wherein the time data writing unit comprises: a ninth thin film transistor and a tenth thin film transistor;

a control electrode of the ninth thin film transistor is connected to the first control signal terminal, a first electrode of the ninth thin film transistor is connected to the first time signal terminal, and a second electrode of the ninth thin film transistor is connected to the second node; and a control electrode of the tenth thin film transistor is connected to the second control signal terminal, a first electrode of the tenth thin film transistor is connected to the second time signal terminal, and a second electrode of the tenth thin film transistor is connected to the second node.

10. The display substrate according to claim 8, wherein the storage unit comprises a second capacitor; a first electrode of the second capacitor is connected to the second node, and a second electrode of the second capacitor is connected to the ground terminal.

11. The display substrate according to claim 8, wherein the switching unit comprises an eleventh thin film transistor; a control electrode of the eleventh thin film transistor is connected to the second node, a first electrode of the eleventh thin film transistor is connected to the micro integrated circuit, and a second electrode of the eleventh thin film transistor is connected to the first electrode of the light-emitting element.

12. A display apparatus, comprising: a display substrate comprising a substrate, a plurality of pixel units disposed on the substrate and at least one micro integrated circuit;

each pixel unit comprises a plurality of sub-pixels, and at least one sub-pixel of the plurality of sub-pixels comprises a light-emitting element and a pixel drive circuit electrically connected to the light-emitting element; the pixel drive circuit comprises at least one thin film transistor; and the at least one micro integrated circuit is electrically connected to at least one pixel unit.

13. The display apparatus according to claim 12, wherein the pixel drive circuit is configured to control an amplitude of a drive current of the light-emitting element, and the micro integrated circuit is configured to control pulse widths of drive currents of a plurality of light-emitting elements.

14. The display apparatus according to claim 13, wherein the micro integrated circuit comprises a plurality of pulse width modulation signal output terminals, and the plurality of pulse width modulation signal output terminals of two micro integrated circuits are connected to a plurality of light-emitting elements of three pixel units in one-to-one correspondence.

15. The display apparatus according to claim 13, wherein the pixel drive circuit comprises a first thin film transistor; a control electrode of the first thin film transistor is connected to a data signal terminal, a first electrode of the first thin film transistor is connected to a first power supply terminal, and a second electrode of the first thin film transistor is connected to a first electrode of the light-emitting element; and a second electrode of the light-emitting element is connected to the micro integrated circuit.

16. The display apparatus according to claim 13, wherein the pixel drive circuit comprises a second thin film transistor, a third thin film transistor, a fourth thin film transistor, a fifth thin film transistor, a sixth thin film transistor, a seventh thin film transistor, an eighth thin film transistor and a first capacitor;

a control electrode of the second thin film transistor is connected to a first node, a first electrode of the second thin film transistor is connected to a second electrode of the eighth thin film transistor and a second electrode of the third thin film transistor, and a second electrode of the second thin film transistor is connected to a first electrode of the fifth thin film transistor and a second electrode of the fourth thin film transistor;

a control electrode of the third thin film transistor is connected to a scanning signal terminal, and a first electrode of the third thin film transistor is connected to a data signal terminal;

a control electrode of the fourth thin film transistor is connected to the scanning signal terminal, and a first electrode of the fourth thin film transistor is connected to the first node;

a control electrode of the fifth thin film transistor is connected to a light-emitting control terminal, and a second electrode of the fifth thin film transistor is connected to a first electrode of the light-emitting element;

a control electrode of the sixth thin film transistor is connected to a reset signal terminal, a first electrode of the sixth thin film transistor is connected to the first node, and a second electrode of the sixth thin film transistor is connected to an initial voltage terminal;

a control electrode of the seventh thin film transistor is connected to the reset signal terminal, a first electrode of the seventh thin film transistor is connected to the second electrode of the fifth thin film transistor, and a second electrode of the seventh thin film transistor is connected to the initial voltage terminal;

a control electrode of the eighth thin film transistor is connected to the light-emitting control terminal, and a first electrode of the eighth thin film transistor is connected to a first power supply terminal;

a first electrode of the first capacitor is connected to the first power supply terminal, and a second electrode of the first capacitor is connected to the first node; and a second electrode of the light-emitting element is connected to the micro integrated circuit.

17. The display apparatus according to claim 12, wherein the pixel drive circuit is configured to control a pulse width of a drive current of the light-emitting element, and the micro integrated circuit is configured to control amplitudes of drive currents of a plurality of light-emitting elements.

18. The display apparatus according to claim 17, wherein the micro integrated circuit comprises a plurality of drive current output terminals, and the plurality of drive current output terminals of the micro integrated circuit are connected to a plurality of light-emitting elements of three pixel units in one-to-one correspondence.

19. The display apparatus according to claim 17, wherein the pixel drive circuit comprises a time data writing unit, a storage unit and a switching unit;

the time data writing unit is connected to a first time signal terminal, a second time signal terminal, a first control signal terminal, a second control signal terminal and a second node, and is configured to output a first time signal of the first time signal terminal to the second node under the control of the first control signal terminal, or, output a second time signal of the second time signal terminal to the second node under the control of the second control signal terminal;

the storage unit is connected to the second node and a ground terminal, and is configured to store the first time signal or the second time signal written by the time data writing unit; and the switching unit is connected to the second node, the micro integrated circuit and a first electrode of the light-emitting element, and is configured to supply a drive current generated by the micro integrated circuit to the first electrode of the light-emitting element under the control of the first time signal or the second time signal.

20. The display apparatus according to claim 19, wherein the time data writing unit comprises: a ninth thin film transistor and a tenth thin film transistor;

a control electrode of the ninth thin film transistor is connected to the first control signal terminal, a first electrode of the ninth thin film transistor is connected to the first time signal terminal, and a second electrode of the ninth thin film transistor is connected to the second node; and a control electrode of the tenth thin film transistor is connected to the second control signal terminal, a first electrode of the tenth thin film transistor is connected to the second time signal terminal, and a second electrode of the tenth thin film transistor is connected to the second node.

* * * * *